United States Patent [19]

Sato

[11] Patent Number: 5,432,104
[45] Date of Patent: Jul. 11, 1995

[54] METHOD FOR FABRICATING A VERTICAL BIPOLAR TRANSISTOR WITH REDUCED PARASITIC CAPACITANCE BETWEEN BASE AND COLLECTOR REGIONS

[75] Inventor: Fumihiko Sato, Tokyo, Japan

[73] Assignee: NEC Corporation, Tokyo, Japan

[21] Appl. No.: 319,638

[22] Filed: Oct. 7, 1994

[30] Foreign Application Priority Data

Oct. 7, 1993 [JP] Japan ................... 5-251254

[51] Int. Cl.$^6$ .................................. H01L 21/331
[52] U.S. Cl. ...................... 437/31; 437/89; 437/162; 437/909; 148/DIG. 10
[58] Field of Search ............ 437/31, 89, 90, 162, 437/33, 909; 148/DIG. 10, DIG. 11, DIG. 124

[56] References Cited

U.S. PATENT DOCUMENTS

| | | | |
|---|---|---|---|
| 4,824,799 | 4/1989 | Komatsu | 437/162 |
| 4,851,362 | 7/1989 | Suzuki | 437/162 |
| 5,039,624 | 8/1991 | Kadota | 437/162 |
| 5,198,373 | 3/1993 | Yoshino | 437/31 |
| 5,204,276 | 4/1993 | Nakajima et al. | 437/162 |
| 5,217,909 | 6/1993 | Bertagnolli | 437/31 |
| 5,294,558 | 3/1994 | Subbanna | 437/31 |
| 5,296,391 | 3/1994 | Sato et al. | 437/31 |
| 5,320,972 | 6/1994 | Wylie | 437/31 |

FOREIGN PATENT DOCUMENTS

4-330730 11/1992 Japan.
0182979 7/1993 Japan ................... 437/31

Primary Examiner—Brian E. Hearn
Assistant Examiner—Tuan Nguyen
Attorney, Agent, or Firm—Burns, Doane, Swecker & Mathis

[57] ABSTRACT

A method of fabricating a vertical bipolar semiconductor device includes a step of forming an $N^-$-type silicon epitaxial layer which constitutes a part of a collector region and a $P^+$-type polycrystalline silicon film which functions as a base lead-out electrode. The silicon epitaxial layer and the polycrystalline silicon film are insulated by a silicon oxide film which is a sufficiently thick insulating film, covers the silicon epitaxial layer and has an opening. In this opening, by selective growth of a first and a second semiconductor film and ion implantation using a first insulating film spacer, there are formed a $P^-$-type single crystal silicon layer, a $P^+$-type polycrystalline silicon film, a $P^+$type single crystal silicon layer (intrinsic base region), a $P^+$-type polycrystalline silicon film, and an N-type single crystal silicon layer. It is possible to reduce the parasitic capacitance between the base region and the collector region without sacrificing the enhancement of the cut-off frequency $f_T$.

7 Claims, 3 Drawing Sheets

METHOD FOR FABRICATING A VERTICAL BIPOLAR TRANSISTOR WITH REDUCED PARASITIC CAPACITANCE BETWEEN BASE AND COLLECTOR REGIONS

BACKGROUND OF THE INVENTION (1) Field of the Invention

The present invention relates to a semiconductor device and a fabrication method therefor, and more particularly to a vertical bipolar transistor and a fabrication method therefor.

(2) Description of the Related Art

In the bipolar transistor, it is known that, the thinner the base region film, the higher will be the cutoff frequency $f_T$ which can be regarded as a yardstick for the operation speed of the transistor. Also known is that, the smaller the transistor becomes, the smaller will be a parasitic capacitance, etc. resulting in a higher speed operation. As a method for forming a thin base region, an ion-implantation method is used, but there is a limit in making a shallow implantation of impurity ions. Also, in the ion-implantation method, it is necessary to eliminate changes in silicon lattice atoms caused by the implanted ions, that is, irregularities or imperfections in silicon single crystals. In an annealing step under high temperature heating, the implanted impurities are diffused. As a result, the base region becomes correspondingly thicker.

As a technique for forming a thin base region, a low temperature epitaxial growth method is known. One of the bipolar transistor fabrication methods utilizing such technique has been disclosed in Japanese Patent Application Kokai Publication No. Hei 4-330730, in which the inventor is the same as that of the present application.

Figure 1:
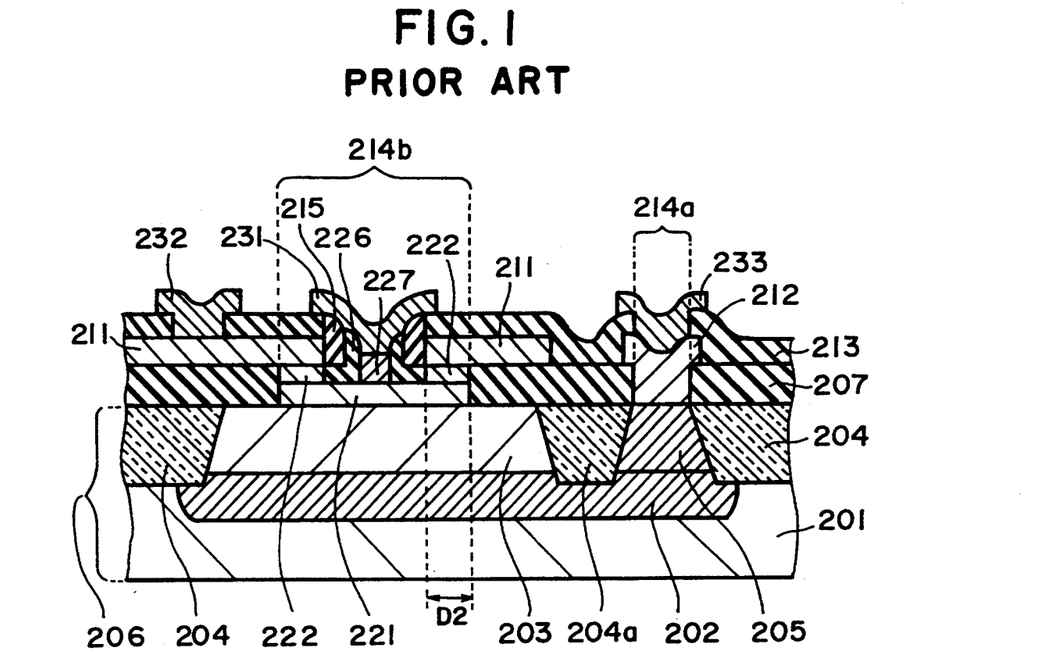
FIG. 1 is a diagrammatic sectional view of a conventional bipolar transistor.

FIG. 1 shows, in a diagrammatic sectional view, a construction of the bipolar transistor disclosed in the above publication. Such construction is as follows:

On a surface of a P⁻-type single crystal silicon substrate 201 having resistivity of 10~15 Ω·cm, an N⁺buried layer 202 having arsenic as impurities is selectively formed. A surface of this P⁻-type single crystal silicon substrate 201 is covered by an N⁻-type silicon epitaxial layer 203 having a thickness of about 0.4 μm and an impurity concentration of about $1 \times 10^{16}$ cm⁻³. Formed in the N⁻-type silicon epitaxial layer 203, using a known selective oxidation method, are element isolation field oxide films 204 and 204a which extend to the P⁻-type single crystal silicon substrate 201 or the N⁺buried layer 202. The field oxide films 204 are to element-isolate respective adjacent bipolar transistors. One side of the N⁻-type silicon epitaxial layer 203 divided by the field oxide film 204a and surrounded by the field oxide film 204 is converted to an N⁺-type collector lead-out region 205 by diffusion of phosphorus. The explanation has thus far covered the construction of the silicon substrate 206.

The upper surface of the silicon substrate 206 is covered by a silicon nitride film 207. In this silicon nitride film 207, an opening 214a which reaches the N⁺-type collector lead-out region 205 and an opening 214b which reaches the N⁻-type silicon epitaxial layer 203 are provided. The opening 214a is covered or filled by an N⁺-type polycrystalline silicon film 212 which is connected to the N⁺-type collector lead-out region 205 so as to become a collector lead-out electrode. The upper surface of the silicon nitride film 207 at the periphery of the opening 214b is covered by the P⁺-type polycrystalline silicon film 211 which has an overhang portion with a width D2 in the inner side of the opening 214b and which serves as a base lead-out electrode. The silicon nitride film 207 and the polycrystalline silicon films 211 and 212 are covered by a silicon oxide film 213. The side surface of the silicon oxide film 213 immediately above the opening 214b is coincident with the side surface of the overhang portion of the P⁺-type polycrystalline silicon film 211, and these side surfaces are provided with a first insulating film spacer 215 constituted by a silicon oxide film.

The upper surface of the N⁻-type silicon epitaxial layer 203 which is exposed to the opening 214b is covered by the P-type single crystal silicon layer 221 which is an intrinsic base region, and the lower surface of the P⁺-type polycrystalline silicon film 211 exposed to the overhang portion is covered by a P⁺-type polycrystalline silicon film 222. These P-type single crystal silicon layer 221 and P⁺-type polycrystalline silicon film 222 are those which have been selectively formed on the surfaces of the single crystal silicon layer and the polycrystalline silicon film by a low temperature epitaxial growth method. The upper surface of the P-type single crystal silicon layer 221 and the lower surface of the P⁺-type polycrystalline silicon film 222 are connected with each other. The side surface and the lower surface of the first insulating film spacer 215 as well as a part of the upper surface of the P-type single crystal silicon layer 221 and a part of the side surface of the P⁺-type polycrystalline silicon film 222 are covered by a second insulating film spacer 226. An air gap defined by the second insulating film spacer 226 is provided with an N-type single crystal silicon layer 227 which fills the air gap and covers the upper surface of the P-type single crystal silicon layer 221 thereby serving as an emitter region. In the silicon oxide film 213, there are provided openings that reach respectively to the P⁺-type polycrystalline silicon film 211 and the N⁺-type polycrystalline silicon film 212. On the upper surface of the silicon oxide film 213, there are provided a metal electrode 231 connected to the N-type single crystal silicon layer 227 and metal electrodes 232 and 233 connected respectively to the P⁺-type polycrystalline silicon film 211 and the N⁺-type polycrystalline silicon film 212 through the openings in the silicon oxide film 213. These metal electrodes 231, 232 and 233 are made of such metal as aluminum.

In the conventional bipolar transistor described above, although it is possible to form a film which is thin when compared with an intrinsic base region formed by the ion-implantation, there are problems as explained henceforth.

The first problem relates to a parasitic capacitance. Insulation between the P⁺-type polycrystalline silicon film 211 which constitutes the base lead-out electrode and the N⁻-type silicon epitaxial layer 203 which constitutes a part of the collector region is made by the silicon nitride film 207. For making good connection between the P⁺-type polycrystalline silicon film 211 and the P-type single crystal silicon layer 221 which is the intrinsic base region, it is not desirable that the thickness of the silicon nitride film 207 be thicker than the sum of the thickness of the P-type single crystal silicon layer 221 which is selectively epitaxially grown and the thickness of the P⁺-type polycrystalline silicon film 222 which is selectively grown simultaneously with the P-type single crystal silicon layer 221. Where the P-type single crystal silicon layer 221 which is the intrinsic base region is made thin in order to enhance the cut-off frequency $f_T$, the thickness of the silicon nitride film 207 must inevitably be made thin. As a result, the parasitic capacitance generated between the base region and the collector region increases thereby deteriorating transistor performances.

The second problem is with fabrication and relates to a problem involved in the selective epitaxial growth. As a preliminary step during such processes as the formation of the first insulating film spacer 215, the formation of the opening 214b, and the formation of the P-type single crystal silicon layer 221 which is the intrinsic base region, the silicon oxide film 213 and the P+-type polycrystalline silicon film 211 at predetermined regions are removed by anisotropic etching. At this time, over-etching is made by taking into consideration the variations in the thicknesses of the P+-type polycrystalline silicon film 211 and the variations in the anisotropic etching. Thus, the silicon nitride film 207 immediately under the P+-type polycrystalline silicon film 211 is removed in a thickness on the order of 10~30 nm. Since the first insulating film spacer 215 is formed when underlying layer state is as above, the lower surface of this first insulating film spacer 215 results in being located at a position about 10~30 nm below the lower surface of the P+-type polycrystalline silicon film 211. Where the epitaxial growth is carried out under such state, there is an adverse effect to the growth of the P+-type polycrystalline silicon film 222 which interconnects the P-type single crystal silicon layer 221 which is the intrinsic base region and the P+-type polycrystalline silicon film 211 which is the base lead-out electrode, which leads to a possible failure in interconnection between them.

The second problem explained above becomes more serious when such layer as the intrinsic base region is formed by the growth of silicon/germanium. This is because the ratio of growth speeds between the polycrystalline silicon film and the single crystal layer during the growth becomes smaller than 1 with an increase in the mixed crystal ratio of germanium. For example, in the case of $Si_{0.9}Ge_{0.1}$, such ratio (growth speed of the polycrystalline film/growth speed of the single crystal layer) is $1/5 \sim \frac{1}{4}$.

SUMMARY OF THE INVENTION

An object of the present invention is to overcome the problems existing in the prior art and to provide a bipolar transistor in which a part of a base region is formed by a selective epitaxial growth method and which enables to reduce parasitic capacitance and to ensure good electrical connection between an intrinsic base region and a base lead-out electrode.

According to an aspect of the invention, there is provided a method of fabricating a semiconductor device, the method comprising the steps of:

forming, on a surface of a single crystal silicon substrate of one conductivity type, selectively a buried layer of an opposite conductivity type, and forming on the resulting entire surface a silicon epitaxial layer of the opposite conductivity type, thereby selectively forming a field oxide film for element isolation in the silicon epitaxial layer;

depositing, on the resulting entire surface, a first insulating film having a predetermined thickness, and forming partially thereon a first polycrystalline semiconductor film of the one conductivity type having a predetermined shape;

depositing, on the entire surface, a second insulating film, and sequentially etching the second insulating film at a predetermined region and a part of the first polycrystalline semiconductor, thereby forming a first opening which extends to the first insulating film;

depositing, on the entire surface, a third insulating film having a predetermined thickness, followed by anisotropic etching, and forming in the first opening a first insulating film spacer constituted by the third insulating film;

etching isotropically the first insulating film using the second insulating film and the first insulating film spacers as masks, and forming in the first insulating film a second opening which has overhang portions, each with a predetermined width, of the first polycrystalline semiconductor film, in which an opening area is larger than that of the first opening, and which extends to the silicon epitaxial layer;

forming, by selective growth of a first semiconductor film, a second polycrystalline semiconductor film of the one conductivity type having a predetermined thickness on a lower surface of the first polycrystalline semiconductor film exposed in the overhang portions, and simultaneously forming a first single crystal semiconductor layer of the one conductivity type having a predetermined thickness on an upper surface of the silicon epitaxial layer exposed in the second opening;

forming, by selective growth of a second semiconductor film, a third polycrystalline semiconductor film of the one conductivity type having a predetermined thickness on a lower surface of the second polycrystalline semiconductor film, and simultaneously forming on an upper surface of the first single crystal semiconductor layer a second single crystal semiconductor layer of the one conductivity type, an upper surface of which is in contact with a lower surface of the third polycrystalline semiconductor film, and an impurity concentration of which is higher than that of the first single crystal semiconductor layer;

conducting ion-implantation of the opposite conductivity type using the second insulating film and the first insulating film spacer as masks, thereby converting the first single crystal semiconductor layer and the silicon epitaxial layer immediately under an air gap defined by the first insulating film spacer to a third single crystal semiconductor layer of the opposite conductivity type, an impurity concentration of which is higher than that of the silicon epitaxial layer;

depositing, on the entire surface, a fourth insulating film having a predetermined thickness, followed by anisotropic etching, and forming a second insulating film spacer constituted by the fourth insulating film at a side surface of the first insulating film spacer; and filling an air gap defined by the second insulating film spacer with a third semiconductor film selectively grown, thereby forming a fourth single crystal semiconductor layer of the opposite conductivity type which covers an upper surface of the second single crystal semiconductor layer.

With the method of fabricating a semiconductor device according to the invention, the first insulating film having a sufficient thickness is formed, followed by the formation of the first opening, the first insulating film spacer and the second opening and, for this second opening, by selective growth of the first semiconductor film, the first single crystal semiconductor layer and the second polycrystalline silicon film are formed and, by selective growth of the second semiconductor film, the second single crystal semiconductor layer and the third polycrystalline semiconductor film are formed. Thus, no connection failure develops between the second single crystal semiconductor layer which becomes the intrinsic base region and the first polycrystalline semiconductor film which constitutes a part of the base lead-out electrode.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 2:
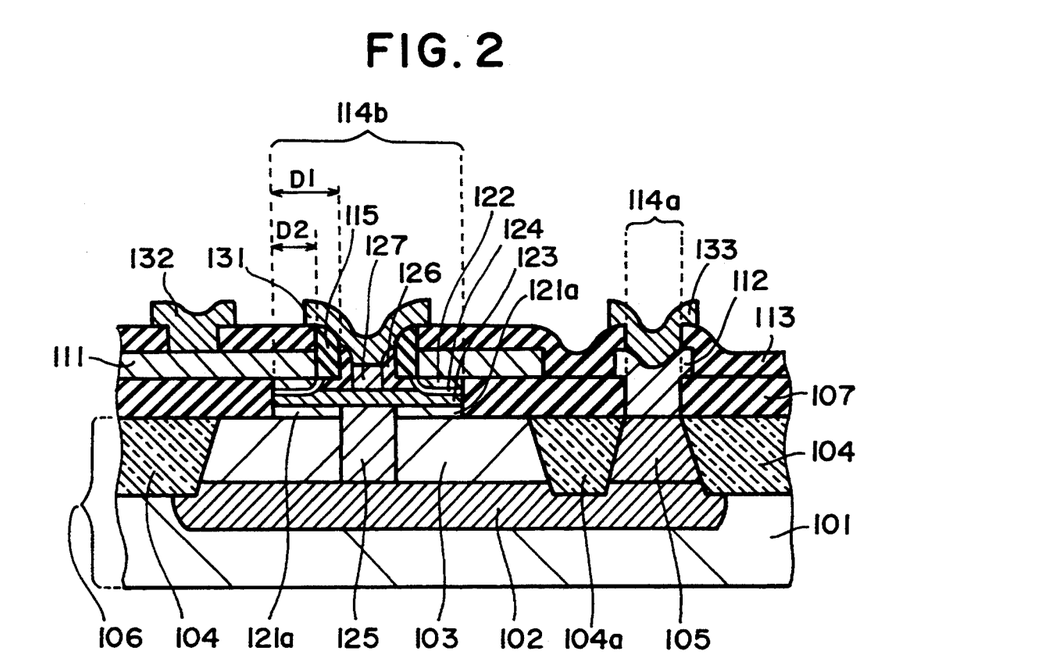
FIG. 2 is a diagrammatic sectional view of a bipolar transistor of a first embodiment according to the invention.

A first embodiment of the invention is explained with reference to FIG. 2.

On a surface of a P$^-$-type single crystal silicon substrate 101 having resistivity of 10~20 Ω·cm at a room temperature and the surface orientation <100>, there is selectively formed an N$^+$buried layer 102 with arsenic or antimony as impurities and having a thickness of about 2 μm. The surface of this P$^-$-type single crystal silicon substrate 101 is covered by an N$^-$-type silicon epitaxial layer 103 having a thickness of about 0.4 μm, containing phosphorus in an impurity concentration in the order of $1 \times 10^{16}$ cm$^{-3}$ and constituting a part of the collector region. Formed in the N$^-$-type silicon epitaxial layer 103 by a known selective oxidation method is a field oxide film 104 or 104a for element isolation, which extends to the P$^-$-type single crystal silicon substrate 101 or the N$^+$buried layer 102. The field oxide film 104 isolates a corresponding bipolar transistor. The N$^-$-type silicon epitaxial layer 103 at one side surrounded by the field oxide film 104 and separated by the field oxide film 104a is converted to an N$^+$-type collector lead-out region 105 which is formed by diffusion of phosphorus and which has an impurity concentration of about $1 \times 10^{19}$ cm$^{-3}$, whereby the collector resistance is reduced. Thus, the silicon substrate 106 is constituted by these P$^-$-type single crystal silicon substrate 101, N$^+$buried layer 102, N$^-$-type silicon epitaxial layer 103, field oxide films 104 and 104a, and N$^+$-type collector lead-out region 105.

The upper surface of the silicon substrate 106 is covered by a silicon oxide film 107 which is the first insulating film. This silicon oxide film 107 is provided with an opening 114a which reaches the N$^+$-type collector lead-out region 105 and an opening 114b which reaches the N$^-$-type silicon epitaxial layer 103. The opening 114a is covered by an N$^+$-type polycrystalline silicon film 112 which is connected to the N$^+$-type collector lead-out region 105 so as to become a collector lead-out electrode. At a predetermined region of the N$^-$-type silicon epitaxial layer 103 within the opening 114b, there is provided an N-type single crystal silicon layer 125 which is a first single crystal semiconductor layer and which extends to the N$^+$buried layer 102 through the N$^-$-type epitaxial layer 103. This N-type single crystal silicon layer 125 constitutes a part of the collector region, and the upper surface thereof is located at a position higher than an upper surface of the N$^-$-type silicon epitaxial layer 103, with the impurity concentration thereof being about $1 \times 10^{17}$ cm$^{-3}$. The distance between the N-type single crystal silicon layer 125 and the opening 114b is D1 (first predetermined width).

The upper surface of the silicon oxide film 107 at a periphery of the opening 114b is covered by the P$^+$-type polycrystalline silicon film 111 which has an overhang portion with D2 (second predetermined width) in a direction inwardly in the opening 114b and which is a first polycrystalline semiconductor film for the base lead-out electrode. The silicon oxide film 107 and the polycrystalline silicon films 111 and 112 are covered by the silicon nitride film 113 which is a second insulating film. Immediately above the opening 114b, the side surface of the silicon nitride film 113 and the side surface of the P$^+$-type polycrystalline silicon film 111 coincide with each other, and these side surfaces are provided with a first insulating film spacer 115 constituted by the silicon nitride film which is a third insulating film. This first insulating film spacer 115 has a thickness (film thickness) which equals D1 minus D2 (D1-D2). That is, the side surface of the first insulating film spacer 115 is located immediately above the end portion of the N-type single crystal silicon layer 125. The lower surface of the first insulating film spacer 115 is located substantially at the same position as the lower surface of the P$^+$-type polycrystalline silicon film 111 (strictly speaking, the location being about 10~30 nm lower).

Between the opening 114b and the N-type single crystal silicon layer 125, there is provided a P$^-$-type single crystal silicon layer 121a as a second single crystal semiconductor layer which covers the upper surface of the N$^-$-type silicon epitaxial layer 103, the upper surface of which coincides with the position of the upper surface of the N-type single crystal silicon layer 125 and which has an impurity concentration of about $1 \times 10^{16}$ cm$^{-3}$. In the opening 114b, the P$^+$-type polycrystalline silicon film 122 which is a second polycrystalline semiconductor film covers the lower surface of the P$^+$-type polycrystalline silicon layer 111 exposing to the overhand portion. Also, the P$^+$-type polycrystalline silicon film 124 which is a third polycrystalline semiconductor film covers the lower surface of the P$^+$-type polycrystalline silicon film 111. These P$^-$-type single crystal silicon layer 121a and P$^+$-type polycrystalline silicon films 122 and 124 respectively constitute parts of the base region. Furthermore, the P$^+$-type single crystal silicon layer 123 having an impurity concentration of about $4 \times 10^{18}$ cm$^{-3}$ covers the upper surfaces of the single crystal silicon layers 121a and 125. The P+-type single crystal silicon layer 123 is a third single crystal semiconductor film and also an intrinsic base region. Furthermore, the P+-type single crystal silicon layer 123 is connected, at its upper surface, to the lower surface of the P+-type polycrystalline silicon film 124.

A part of the side surface of the first insulting film spacer 115, a part of the upper surface of the P+-type single crystal silicon layer 123 and a part of the lower surface of the P+-type polycrystalline silicon film 124 are covered by the second insulating film spacer 126 constituted by the silicon oxide film which is a fourth insulating film. In the air gap defined by the second insulating film spacer 126, there is provided an N+-type single crystal silicon layer 127 which fills the air gap and covers the upper surface of the P+-type single crystal silicon layer 123 and which is an emitter region and a fourth single crystal semiconductor layer. In the silicon nitride film 113, there are provided openings which extend respectively to the P+-type polycrystalline silicon film 111 and the N+-type polycrystalline silicon film 112. On this silicon nitride film 113, there are provided a metal electrode 131 connected to the N+-type single crystal silicon layer 127 and metal electrodes 132 and 133 connected respectively to the P+-type polycrystalline silicon film 111 and N+-type polycrystalline silicon film 112. These metal electrodes 131, 132 and 133 are constituted by aluminum alloy films, for example, aluminum/silicon alloy films.

In the first embodiment explained above, the N-type single crystal silicon layer 125 is present, so that the collector resistance is further reduced. Also, since the P−-type single crystal silicon layer 121a is provided, it is possible to increase the thickness of the silicon oxide film 107 which is the first insulating film and to reduce the thickness of the P+-type single crystal silicon layer 123 which is the intrinsic base region. As a result, it is possible to reduce the parasitic capacitance between the collector region and the base region and, at the same time, enhance the cut-off frequency $f_T$. Thus, by adopting this embodiment of the invention, it is possible to readily realize transistors having high speed performances.

Further, the emitter region in the first embodiment explained above is constituted by the N+-type single crystal silicon layer 127, but this may well be constituted by an N+-type single crystal silicon film (in which case this N+-type single crystal silicon film becomes the fourth single crystal semiconductor layer) which is provided on the surface of the P+-type single crystal silicon layer 123 that is exposed to the air gap defined by the second insulating film spacer 126. In this case, there is provided an N+-type polycrystalline silicon film (a fourth polycrystalline semiconductor film and also an emitter lead-out electrode) which fills the air gap defined by the second insulating film spacer 126.

FIGS. 3A to 3D show, in sectional views, sequential steps of fabricating the bipolar transistor of the first embodiment according to the invention. In the explanation of the fabrication method, the ordinal numbers used for expressing, for example, first, second, third single crystal semiconductor layers, etc. in FIG. 2 are used herein in different order for ease of explanation.

Figure 3A:
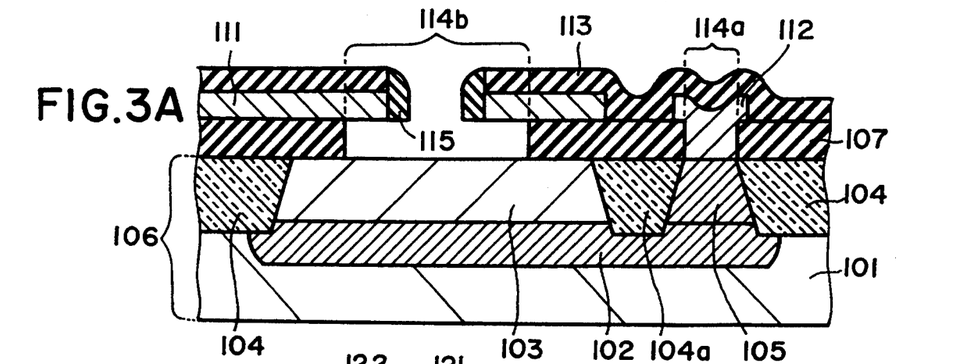
FIGS. 3A to 3D are diagrammatic sectional views for showing sequential steps of fabricating the bipolar transistor of the first embodiment according to the invention.
Figure 3B:
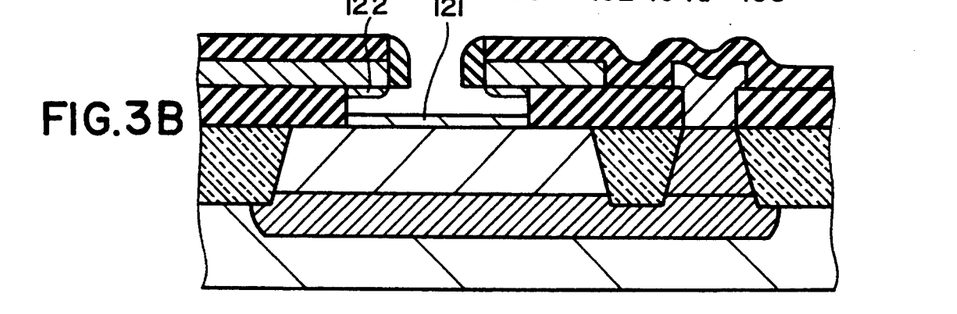

First, on a surface of a P−-type single crystal silicon substrate 101 having the resistivity of 10∼20 Ω·cm at the room temperature and the surface orientation <100>, there is selectively formed by a known technique an N+buried layer 102 with arsenic or antimony as impurities and having a thickness of about 2 μm. On the entire surface thereof is formed an N−-type silicon epitaxial layer 103 having a thickness of about 0.4 μm, containing phosphorus in an impurity concentration in the order of $1 \times 10^{16}$ cm$^{-3}$ and constituting a part of the collector region. The N−-type silicon epitaxial layer 103 at the predetermined region is subjected to thermal oxidation process using a known selective oxidation method, resulting in the formation of a field oxide film 104 or 104a for element isolation, which extends to the P−-type single crystal silicon substrate 101 or the N+buried layer 102. Then, a silicon oxide film 107 which is a first insulating film having a predetermined film thickness (for example, 150 nm) is deposited on the resulted entire surface. This silicon oxide film 107 is provided with the opening 114a which extends to the N−-type silicon epitaxial layer 103 on one side which is surrounded by the field oxide film 104 and separated by the field oxide film 104a.

Subsequently, a polycrystalline silicon film having a predetermined film thickness is deposited on the resulted entire surface. This polycrystalline silicon film is converted to the N+-type polycrystalline silicon film by diffusion of phosphorus and, after the PSG (phosphosilicate glass) film formed by the phosphorus diffusion is removed, the N+-type polycrystalline silicon film is patterned and the N+-type polycrystalline silicon film 112 which is the collector lead-out electrode covering the opening 114a is formed. Then, phosphorus diffusion is enhanced by thermal oxidation, so that the N−-type silicon epitaxial layer 103 immediately under the opening 114a becomes the N+-type collector lead-out region 105 having an impurity concentration of about $1 \times 10^{19}$ cm$^{-3}$ and, at the same time, a silicon oxide film (now shown) having a predetermined film thickness is formed on the exposed surface of the N+-type polycrystalline silicon film 112. Also, this results in the formation of the silicon substrate 106 constituted by the P−-type single crystal silicon substrate 101, N+buried layer 102, N−-type silicon epitaxial layer 103, field oxide films 104 and 104a, and N+-type collector lead-out region 105.

Subsequently, a polycrystalline silicon film having a predetermined film thickness is again deposited on the resulted entire surface. This polycrystalline silicon film is converted to the P+-type polycrystalline silicon film by diffusion of boron and, after the BSG film formed by the diffusion is removed, the P+-type polycrystalline silicon film is patterned, and the P+-type polycrystalline silicon film 111 which covers at least a part of the N−-type silicon epitaxial layer 103 and which becomes the base lead-out electrode of the first polycrystalline semiconductor film is formed.

Next, a silicon nitride film 113 which is a second insulating film is deposited on the resulted entire surface. The silicon nitride film 113 and the P+-type polycrystalline silicon film 111 at the predetermined regions surrounding the region forming the emitter region are sequentially anisotropically removed, whereby a first opening is formed. Since this anisotropic etching is performed so as to result in over-etching, the silicon oxide film 107 which is the first insulating film at the lower surface of the first opening is also etched in the order of 10∼30 nm. On the entire surface, the silicon nitride film as a third insulating film having the predetermined film thickness (see D1–D2 in FIG. 2) is deposited, which is subjected to an anisotropic etching by RIE (reactive-ion etching). In this way, in the first opening, there is formed a first insulating film spacer 115 which covers the sides of the silicon nitride film 113 and the P+-type polycrystalline silicon film 111 and which is formed by the silicon nitride film as the third insulating film. Due to the over-etching for the formation of the first opening, the lower surface of the first insulating film spacer 115 is located substantially at the same position as the lower surface of the P+-type polycrystalline silicon film 111 (strictly speaking, the location being about 10~30 nm lower).

Then, by using the silicon nitride film 113 and the first insulating film spacer 115 as masks, the silicon oxide film 107 is subjected to sufficient wet-etching by buffered hydrofluoric acid. Through this etching, the silicon oxide film 107 is provided with a second opening 114b which extends to the N−-type silicon epitaxial layer 103. The silicon oxide film 107 under the P+-type polycrystalline silicon film 111 and the first insulating film spacer 115 is undercut by the width D1, so that the second opening 114b is wider by the width D2 (in FIG. 2) compared with the first opening. Thus, the overhang portion with the width D2 of the P+-type polycrystalline silicon film 111 is formed in the second opening 114b (FIG. 3A).

In this first embodiment, since the first insulating film is constituted by the silicon oxide-film 107 and the second and third insulating films (the silicon nitride film 111 and the first insulating film spacer 115) are constituted by the silicon nitride film, the isotropic etching for the formation of such as the second opening 114b is facilitated. Also, unlike the case where the first insulating film is constituted by a silicon nitride film, it is possible to avoid the contamination (changes in the impurity concentration, etc.) of the N−-type silicon epitaxial layer surface caused by the isotropic etching for the formation of the second opening.

Next, for growing a first semiconductor film using a low temperature CVD, called an UHV (ultra high vacuum)/CVD of cold-wall type, a selective growth of silicon doped with a low concentration of boron takes place in a film forming device. In this way, on the surface of the N−-type silicon epitaxial layer 103 which exposes to the second opening 114b, the p−-type single crystal silicon layer 121 is formed, which is a first single crystal semiconductor film and in which the boron concentration is about $1 \times 10^{16}$ cm$^{-3}$ and the film thickness is about 30 nm. At the same time, on the lower surface of the P+-type polycrystalline silicon film 111 at the above described overhang portion, there is formed a P−-type polycrystalline silicon film covering such lower surface. The film thickness and the impurity concentration of the P−-type polycrystalline silicon film are respectively the same as those of the P−-type single crystal silicon layer 121. In the film forming device, thermal treatment takes place under, for example, 900° C. for 5 minutes. Thus, the P−-type polycrystalline silicon film, with boron being diffused from the P+-type polycrystalline silicon film 111, is converted to the P+-type polycrystalline silicon film 122 (FIG. 3B) which is a second polycrystalline semiconductor film and which has the boron concentration of about $1 \times 10^{19}$ cm$^{-3}$. The location of the lower surface of the P+-type polycrystalline silicon film 122 is not higher than that of the lower surface of the first insulating film spacer 115. In this selective growth of silicon, the growth speed of the single crystal silicon layer and that of the polycrystalline silicon film are substantially the same.

Figure 3C:
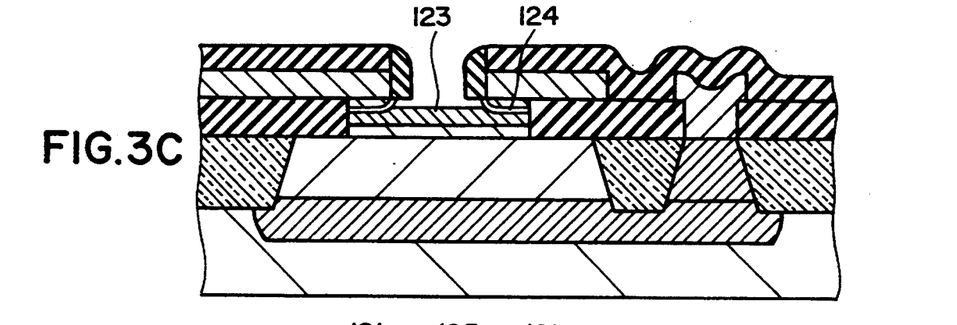

Further, in the film forming device described above, a process such as selective growth of silicon doped with boron for the growth of a second semiconductor film takes place. Thus, the P+-type polycrystalline silicon film 124 which covers the lower surface of the P+-type polycrystalline silicon film 122 is formed. This P+-type polycrystalline silicon film 124 is a third polycrystalline semiconductor film and has a thickness of about 60 nm. At the same time, a P+-type single crystal silicon layer 123 is formed, which covers the upper surface of the P−-type single crystal silicon layer 121 and is connected to the lower surface of the P+-type polycrystalline silicon film 124. This P+-type single crystal silicon layer 123 is a second single crystal semiconductor layer and becomes the intrinsic base region. The thickness of this P+-type single crystal silicon layer 123 is about 60 nm. The boron concentration of the P+-type single crystal silicon layer 123 is about $4 \times 10^{18}$ cm$^{-3}$ and the profile in the direction of the depth thereof is substantially uniform (FIG. 3C). In this embodiment, since the thickness of the silicon oxide film 107 as the first insulating film can be made sufficiently thick, there is no possibility for preventing the formation of the P+-type polycrystalline silicon film 124 (and the P+-type polycrystalline silicon film 122).

Figure 3D:
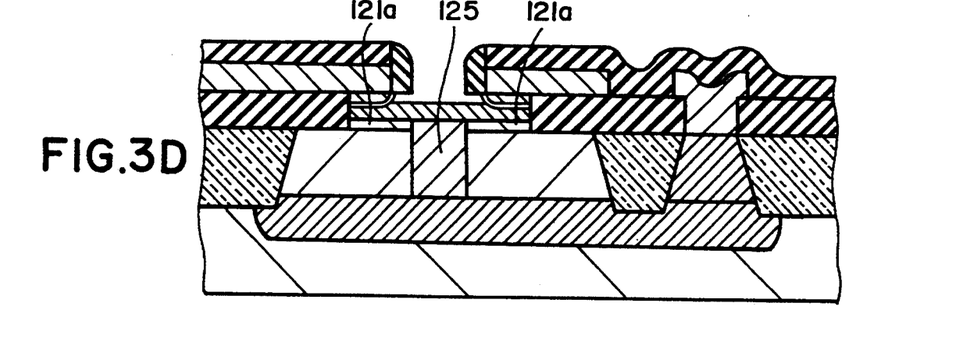

Next, by using the silicon nitride film 113, the first insulating film spacer 115, etc. as masks, ion implantation of phosphorus is repeated a number of times. The examples of ion implantation conditions are as follows: First ion implantation is with 60 KeV, $1 \times 10^{12}$ cm$^{-3}$. Second ion implantation is with 120 KeV, $1.5 \times 10^{12}$ cm$^{-3}$. Third ion implantation is with 260 KeV, $3 \times 10^{13}$ cm$^{-3}$. Then, a thermal treatment such as lamp annealing is performed, for example, for 10 minutes at the temperature of 900° C. After a series of these treatments, the P−-type single crystal silicon layer 121 and the N−-type silicon epitaxial layer 103 immediately under the air gap defined by the first insulating film spacer 115 are converted to the N-type single crystal silicon layer 125 which is a third single crystal semiconductor layer (FIG. 3D). Although it may be theoretically possible to form the N-type single crystal silicon layer 125 preceding the formation of the P+-type single crystal silicon layer 123 and the P+-type polycrystalline silicon film 124, the sequence described with respect to the embodiment of the invention is preferred from the view point of the morphology of the single crystal semiconductor layer.

Now, on the entire surface, the silicon oxide film having a predetermined film thickness is deposited as a fourth insulating film, and the resulting film is subjected to an anisotropic etching by RIE. Thus, with this silicon oxide film, a second insulating film spacer 126 is formed (see FIG. 2). This second insulating film spacer 126 covers the lower surface and a part of the side surface of the first insulating film spacer 115, a part of the upper surface of the P+-type single crystal silicon layer 123, and a part of the lower surface of the P+-type polycrystalline silicon film 124. By selectively growing a third semiconductor film, the N+-type single crystal silicon layer 127 is formed, which fills the air gap defined by the second insulating film spacer 126 and covers the upper surface of the P+-type single crystal silicon layer 123. This N+-type single crystal silicon layer 127 constitutes an emitter region and is a fourth single crystal semiconductor layer. The silicon nitride film 113 are provided with openings which respectively extend to the P+-type polycrystalline silicon film 111 and the N+-type polycrystalline silicon film 112. On the entire surface, an aluminum alloy film (for example, aluminum/silicon alloy film) is formed. This aluminum type alloy film is patterned thereby forming a metal electrode 131 which is connected to the N+-type single crystal silicon layer 127 and metal electrodes 132 and 133 which are connected respectively to the P+-type polycrystalline silicon film 111 and the N+-type polycrystalline silicon film 112 through the above described openings. Thus, the semiconductor device of this embodiment as shown in FIG. 2 is obtained.

In this fabrication method of the first embodiment, alternative to the formation of the N+-type single crystal silicon layer 127 which is the emitter region and which is formed by the selective growth of the third semiconductor film, it is possible to form an N+-type polycrystalline silicon film and, in self-alignment therewith, form an N+-type single crystal silicon layer as the emitter region on the surface of the P+-type single crystal silicon layer 123.

Figure 4:
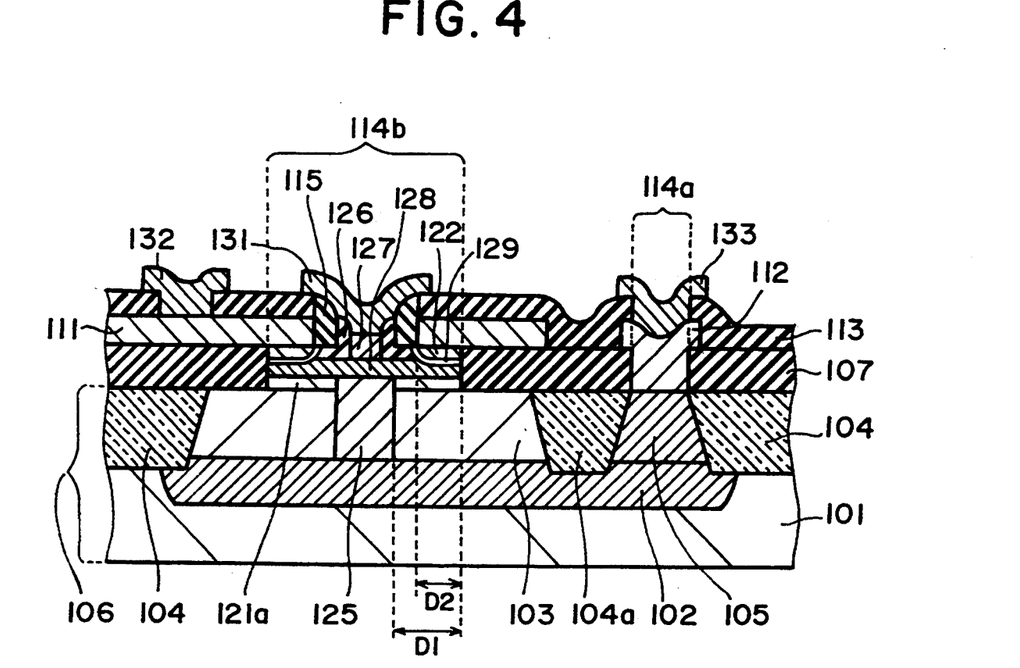
FIG. 4 is a diagrammatic sectional view of a bipolar transistor of a second embodiment according to the invention.

FIG. 4 is a diagrammatic sectional view of a semiconductor device of a second embodiment according to the invention. The arrangement in this embodiment differs from that in the first embodiment in the following points: In this embodiment, the intrinsic base region is constituted by a P+-type single crystal silicon/germanium alloy layer 128. Also, the third polycrystalline semiconductor film that covers the lower surface of the P+-type polycrystalline silicon film 122 and is connected to the P+-type single crystal silicon/germanium alloy layer 128 is constituted by a P+-type polycrystalline silicon/germanium alloy film 129. In this second embodiment, since the intrinsic base region is constituted by the P+-type single crystal silicon/germanium alloy layer 128, its forbidden band width becomes narrower than that of the N+-type single crystal silicon layer 127 which the emitter region. For this reason, the bipolar transistor of this embodiment exhibits more enhanced cut-off frequency $f_T$ and greater current amplification factor $h_{FE}$ compared with those in the first embodiment according to the invention.

In this second embodiment, despite the fact the silicon/germanium selective growth is made as the selective growth of the second semiconductor film, there is no occurrence of such a problem as that explained as the second problem with respect to the prior art disclosed in the identified Kokai publication of the Japanese patent application. This is because, in the same way as in the above explained first embodiment, the P+-type single crystal silicon layer 121 and the P+-type polycrystalline silicon film 122 are formed preceding the formation of the above selective growth.

Figure 5:
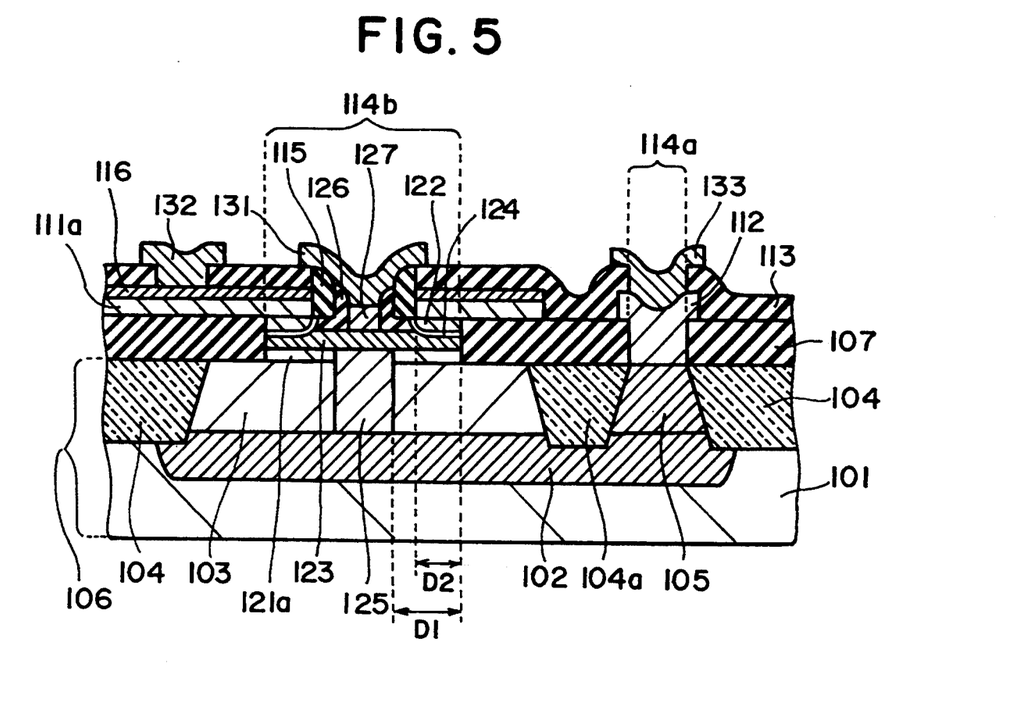
FIG. 5 is a diagrammatic sectional view of a bipolar transistor of a third embodiment according to the invention.

FIG. 5 is a diagrammatic sectional view showing a semiconductor device of a third embodiment according to the invention. The difference in this embodiment from the first embodiment resides in the following: The base leadout electrode in this embodiment is constituted by stacked films of a P+-type polycrystalline silicon film 111a and a titanium silicide film 116. For this reason, the base resistance is further reduced in this embodiment as compared with the first embodiment.

The ways in which the base lead-out electrode is formed in this third embodiment may be summarized as follows: After the formation of the N+-type polycrystalline silicon film 112 and the N+-type collector lead-out region 105, a polycrystalline silicon film is formed on the entire surface. After this polycrystalline silicon film is subjected to boron diffusion and converted to the P+-type polycrystalline silicon film, a BSG film is removed. After a titanium film is formed on the entire surface by sputtering, a titanium silicide film is formed by thermal treatment. Subsequently, the stacked films are patterned whereby the base lead-out electrode is formed, which is constituted by the stacked films of the P+-type polycrystalline silicon film 111a and the titanium silicide film 116.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a semiconductor device, said method comprising the steps of:

forming a single crystal silicon substrate of a first conductivity type, which has a buried layer of a second conductivity type provided selectively on a surface of said substrate and which is selectively covered at the surface thereof by a silicon epitaxial layer of a second conductivity type;

forming a first single crystal semiconductor layer of the second conductivity type, which has an upper surface at a position higher than an upper surface of said silicon epitaxial layer and which extends to said buried layer through said silicon epitaxial layer at a region;

forming a first insulating film which has an opening having a first width from an upper surface end portion of said first single crystal semiconductor layer and which covers said silicon epitaxial layer;

forming a second single crystal semiconductor layer of the first conductivity type which is provided in said opening, which has an upper surface coincident with an upper surface of said first single crystal semiconductor layer and which covers the upper surface of said silicon epitaxial layer;

forming a base lead-out electrode which partly contains a first polycrystalline semiconductor film of the first conductivity type covering an upper surface of said first insulating film and which has an overhang portion having a second width inside said opening;

forming a second insulating film which partly covers an upper surface of said base lead-out electrode immediately above said opening and a side surface of which immediately above said opening is disposed in the same plane as a side surface of said base lead-out electrode;

forming a first insulating film spacer constituted by a third insulating film, a lower surface of which substantially coincides in height with a lower surface of said base lead-out electrode, which has a width equal to a difference between said first width and said second width, and which covers side surfaces of said base lead-out electrode and said second insulating film;

forming a second polycrystalline semiconductor film of the first conductivity type, which covers a lower surface of said first polycrystalline semiconductor film at said overhang portion;

forming a third polycrystalline semiconductor film which covers a lower surface of said second polycrystalline semiconductor film;

forming a third single crystal semiconductor layer of the first conductivity type, an upper surface of which is partly connected to a lower surface of said third polycrystalline semiconductor film, and a lower surface of which covers said first single crystal semiconductor layer and said second single crystal semiconductor layer;

forming a second insulating film spacer constituted by a fourth insulating film, which covers a part of lower surface of said third polycrystalline semiconductor film, a part of upper surface of said third single crystal semiconductor layer, a lower surface of said first insulating film spacer, and a part of side surface of said first insulating film spacer; and forming a fourth single crystal semiconductor layer of the second conductivity type, which fills an air gap defined by said second insulating film spacer and which covers an upper surface of said third single crystal semiconductor layer.

2. The method of fabricating a semiconductor device, according to claim 1 in which said first, second, third and fourth single crystal semiconductor layers and said first, second and third polycrystalline semiconductor films are made from silicon.

3. The method of fabricating a semiconductor device according to claim 1, in which said first, second and fourth single crystal semiconductor layers and said first and second polycrystalline semiconductor films are made from silicon, and said third single crystal semiconductor layer and said third polycrystalline semiconductor film are made from silicon germanium.

4. The method of fabricating a semiconductor device according to claim 1, in which said base lead-out electrode is formed by said first polycrystalline semiconductor film and a high refractory metal silicide film covering an upper surface of said first polycrystalline semiconductor film.

5. The method of fabricating a semiconductor device according to claim 1, in which said first insulating film is made from a material which is different from that of each of said second and third insulating films.

6. A method of fabricating a semiconductor device, said method comprising the steps of:

forming, on a surface of a single crystal silicon substrate of one conductivity type, selectively a buried layer of an opposite conductivity type, and forming on the resulting entire surface a silicon epitaxial layer of the opposite conductivity type, thereby selectively forming a field oxide film for element isolation in said silicon epitaxial layer;

depositing, on the resulting entire surface, a first insulating film having a thickness, and forming partially thereon a first polycrystalline semiconductor film of the one conductivity type having a shape;

depositing, on the entire surface, a second insulating film, and sequentially etching said second insulating film at a region and a part of said first polycrystalline semiconductor, thereby forming a first opening which extends to said first insulating film;

depositing, on the entire surface, a third insulating film having a thickness, followed by anisotropic etching, and forming in said first opening a first insulating film spacer constituted by said third insulating film;

etching isotropically said first insulating film using said second insulating film and said first insulating film spacers as masks, and forming in said first insulating film a second opening which has overhang portions, each with a width, of said first polycrystalline semiconductor film, in which an opening area is larger than that of said first opening, and which extends to said silicon epitaxial layer;

forming, by selective growth of a first semiconductor film, a second polycrystalline semiconductor film of the one conductivity type having a thickness on a lower surface of said first polycrystalline semiconductor film exposed in said overhang portions, and simultaneously forming a first single crystal semiconductor layer of the one conductivity type having a thickness on an upper surface of said silicon epitaxial layer exposed in said second opening;

forming, by selective growth of a second semiconductor film, a third polycrystalline semiconductor film of the one conductivity type having a thickness on a lower surface of said second polycrystalline semiconductor film, and simultaneously forming on an upper surface of said first single crystal semiconductor layer a second single crystal semiconductor layer of the one conductivity type, an upper surface of which is in contact with a lower surface of said third polycrystalline semiconductor film, and an impurity concentration of which is higher than that of said first single crystal semiconductor layer;

conducting ion-implantation of the opposite conductivity type using said second insulating film and said first insulating film spacer as masks, thereby converting said first single crystal semiconductor layer and said silicon epitaxial layer immediately under an air gap defined by said first insulating film spacer to a third single crystal semiconductor layer of the opposite conductivity type, an impurity concentration of which is higher than that of said silicon epitaxial layer;

depositing, on the entire surface, a fourth insulating film having a thickness, followed by anisotropic etching, and forming a second insulating film spacer constituted by said fourth insulating film at a side surface of said first insulating film spacer; and filling an air gap defined by said second insulating film spacer with a third semiconductor film selectively grown, thereby forming a fourth single crystal semiconductor layer of the opposite conductivity type which covers an upper surface of said second single crystal semiconductor layer.

7. A method of fabricating a semiconductor device, said method comprising the steps of:

forming, on a surface of a single crystal silicon substrate of one conductivity type, selectively a buried layer of an opposite conductivity type, and forming on the resulting entire surface a silicon epitaxial layer of the opposite conductivity type, thereby selectively forming a field oxide film for element isolation in said silicon epitaxial layer;

depositing, on the resulting entire surface, a first insulating film having a thickness, and forming partially thereon a first polycrystalline film of the one conductivity type having a shape;

depositing, on the entire surface, a second insulating film, and sequentially etching said second insulating film at a region and a part of said first polycrystalline semiconductor, thereby forming a first opening which extends to said first insulating film;

depositing, on the entire surface, a third insulating film having a predetermined thickness, followed by anisotropic etching, and forming in said first opening a first insulating film spacer constituted by said third insulating film;

etching isotropically said first insulating film using said second insulating film and said first insulating film spacers as masks, and forming in said first insulating film a second opening which has overhang portions, each with a width, of said first polycrystalline semiconductor film, in which an opening area is larger than that of said first opening, and which extends to said silicon epitaxial layer;

forming, by selective growth of a first semiconductor film, a second polycrystalline semiconductor film of the one conductivity type having a thickness on a lower surface of said first polycrystalline semiconductor film exposed in said overhang portions, and simultaneously forming a first single crystal semiconductor layer of the one conductivity type having a thickness on an upper surface of said silicon epitaxial layer exposed in said second opening;

forming, by selective growth of a second semiconductor film, a third polycrystalline semiconductor film of the one conductivity type having a thickness on a lower surface of said second polycrystalline semiconductor film, and simultaneously forming on an upper surface of said first single crystal semiconductor layer a second single crystal semiconductor layer of the one conductivity type, an upper surface of which is in contact with a lower surface of said third polycrystalline semiconductor film, and an impurity concentration of which is higher than that of said first single crystal semiconductor layer;

conducting ion-implantation of the opposite conductivity type using said second insulating film and said first insulating film spacer as masks, thereby converting said first single crystal semiconductor layer and said silicon epitaxial layer immediately under an air gap defined by said first insulating film spacer to a third single crystal semiconductor layer of the opposite conductivity type, an impurity concentration of which is higher than that of said silicon epitaxial layer;

depositing, on the entire surface, a fourth insulating film having a thickness, followed by anisotropic etching, and forming a second insulating film spacer constituted by said fourth insulating film at a side surface of said first insulating film spacer; and forming a fourth polycrystalline semiconductor film of the opposite conductivity type which fills an air gap defined by said second insulating film spacer and covers an upper surface of said second single crystal semiconductor layer, and forming a fourth single crystal semiconductor layer of the opposite conductivity type on a surface of said second single crystal semiconductor layer in self-alignment with said fourth polycrystalline semiconductor film.

* * * * *